United States Patent [19]
Nowicki

[11] Patent Number: 5,330,607
[45] Date of Patent: Jul. 19, 1994

[54] SACRIFICIAL METAL ETCHBACK SYSTEM

[75] Inventor: Ronald S. Nowicki, Sunnyvale, Calif.

[73] Assignee: Genus, Inc., Sunnyvale, Calif.

[21] Appl. No.: 938,303

[22] Filed: Aug. 27, 1992

Related U.S. Application Data

[63] Continuation of Ser. No. 601,508, Oct. 23, 1990, abandoned.

[51] Int. Cl.⁵ ............................................. H01L 21/00
[52] U.S. Cl. ..................................... 156/345; 156/643; 156/656; 118/723 R; 118/728
[58] Field of Search .................. 156/345, 643, 656; 118/723, 728; 204/298.31, 298.02, 298.15

[56]   References Cited
U.S. PATENT DOCUMENTS 4,350,578  9/1982  Frieser et al. .................. 204/298.31
4,563,240  1/1986  Shibata et al. ...................... 156/345
4,793,975  12/1988  Drage ..................................... 156/345
4,980,018  12/1990  Mu et al. ............................... 156/643

FOREIGN PATENT DOCUMENTS 61-224423  10/1986  Japan .
62-47131   2/1987   Japan .

Primary Examiner—R. Bruce Breneman
Assistant Examiner—George Goudreau
Attorney, Agent, or Firm—Donald R. Boys

[57]   ABSTRACT

An etchback apparatus for use in integrated circuit processing after via fill to remove excess metal and leave plugged vias, has a sacrificial ring with a surface consisting substantially of a metal that etches much like the metal used to fill the vias. The excess surface area in the process provides sacrificial metal so microloading is avoided. he metal used to fill the vias.

9 Claims, 2 Drawing Sheets

SACRIFICIAL METAL ETCHBACK SYSTEM

CROSS REFERENCE TO RELATED APPLICATIONS

This is a continuation of application Ser. No. 07/601,508, filed Oct. 23, 1990, now abandoned.

FIELD OF THE INVENTION

This invention is in the field of apparatus and methods for performing patterning by etching of thin metal films in the manufacture of integrated circuits, and has particular utility in performing etch-back processing after via fill, or prior to other film patterning, in integrated circuit manufacturing.

BACKGROUND OF THE INVENTION

In the manufacture of integrated circuits, thin films of various materials are deposited onto on wafers of semiconducting material, such as doped silicon. Specific selected areas of deposited films are removed to form structures and circuitry. Physical Vapor Deposition (PVD) and Chemical Vapor Deposition (CVD) are well known processes for depositing such thin films. For example, polysilicon is typically deposited from a mixture of silane gas (SiH$_4$) and hydrogen. Similarly, tungsten silicide is deposited from a mixture of gases including silane and a tungsten-bearing gas such as tungsten hexafhoride. Pure tungsten is also deposited on silicon wafers in the manufacture of integrated circuits, sometimes selectively and sometimes across the entire surface in a process known as "blanket" tungsten.

Typically during fabrication of integrated circuits, where it is necessary to form electrical connection between different layers, channels called vias are etched through the layers that are usually oxide to provide access to underlying electrically conductive layers so electrical connections can be made. Electrical contact is then established with the underlying layers by coating the wafer with tungsten over the entire wafer surface to fill the vias, then etching away the excess tungsten to leave the vias filled with tungsten. The filled vias are called "plugs". Subsequent metallization and patterning can connect these plugs to allow device operation.

Via fill and etchback has been accomplished in a number of different ways. For example, a blanket tungsten CVD process can be used to fill the vias while covering the entire wafer surface with tungsten. The tungsten is then etched away until only the vias are left with tungsten.

A significant problem with the blanket tungsten approach is presented by the fact that the original topography of the wafer with vias is uneven, and the coating tends to replicate the original topography. If the etchback is initiated with an uneven topography, which may result from thick and thin films of tungsten on the same wafer, the etch proceeds unevenly as well. In this circumstance it is not possible to terminate the etch with all of the vias plugged to their full depth with tungsten. One way of combatting the uneven etch problem is to make the blanket tungsten layer thick enough to "planarize". The surface can also be planarized with a coating of a different sort, such as photoresist or silicon dioxide, before the etchback.

Another way is to use a selective tungsten CVD process which deposits tungsten selectively in the vias. In the selective process, since the vias are of different depth and often of different size and shape, the process has to be continued until all the vias are filled, so many are overfilled. The overfilled vias are called "nailheads" in the art. In this procedure the already uneven topography is made more uneven by the nailheads. To do a uniform etch with the selective approach, planarization is also necessary before the etchback step.

Even with a planar starting surface there are significant problems in etching so that all vias are filled uniformly with tungsten. One of the more serious problems is called "microloading" in the art. In the etch process, with a fixed amount of power, a relatively constant gas flow, and a relatively constant surface area of tungsten and other material exposed to the plasma, the etch proceeds evenly and smoothly. If one of the variables suddenly changes without adequate compensation of other variables, the etch rate may change drastically as well. In the blanket tungsten etch process this happens at the time in the process that the surface tungsten begins to be depleted. i.e. in the regions of thinner tungsten.

Since it is not possible to make the tungsten thickness exactly uniform over the entire wafer surface, the broad area of tungsten will disappear first at the places on the wafer that the tungsten layer is thinnest, usually near the periphery of the wafer. In these areas etching becomes concentrated and much more rapid in the vias, while on other parts of the wafer, etching is still at the slower rate. Another mechanism that contributes to the higher rates is that uncovering more oxide results in additional oxygen activation of fluorine etch species in the plasma. The end result is that some vias are properly filled and some with an excess amount of tungsten are removed. This is referred to as "microloading" in the art. Microloading can also be a problem with the selective process if all of the nailheads do not have the same height and area.

A useful article that discusses the microloading phenomenon is "Plasma Etching Methods for the Formation of Planarized Tungsten Plugs Used in Multilevel VLSI Metallizations" by R. J. Saia, et al. in the *Journal of the Electrochemical Society*, April 1988. This article is incorporated by reference in this specification.

A number of different approaches have been taken to compensate for the microloading problem, such as extreme care in planarization, and proceeding very slowly in etching, particularly near the end of the etch process. Other methods include a process in which a layer of silicon nitride is deposited on the wafer to act as a sacrificial material during the etchback to defeat the microloading effect. i.e. no oxide being exposed. The sacrificial SiN approach is described in an article "A Novel Blanket Tungsten Etchback Scheme" by J. M. F. G. van Learhoven et al., presented at the 1989 IEEE VMIC Conference Jun. 12–13, 1989. A problem with that approach is that the extra layer of material requires extra processing steps in the overall process flow.

What is needed is an apparatus and method to overcome the microloading effect without increasing the time for or the complexity of the etchback process.

SUMMARY OF THE INVENTION

An apparatus is provided according to a preferred embodiment of the invention with a substrate support having a substantially flat surface for supporting a substrate during processing. A sacrificial metal ring with a surface consisting substantially of a metal that etches much like tungsten is in contact with the substrate support, and the substrate support is connected to an alternating current power supply (or may be grounded in an opposing electrode is powered). During etchback processing, as metal is removed from the surface of a wafer, leaving metal in the vias, the sacrificial ring provides sufficient surface area to the sputtering process that microloading does not occur.

In the preferred embodiment, the apparatus is configured for wafers and the surface of the sacrificial ring is tungsten. Other refractory metals from group VI of the periodic table are useful, as well. An embodiment is also provided for use with automatic processing, accommodating robotic transfers.

DESCRIPTION OF THE PREFERRED EMBODIMENTS

Figure 1:
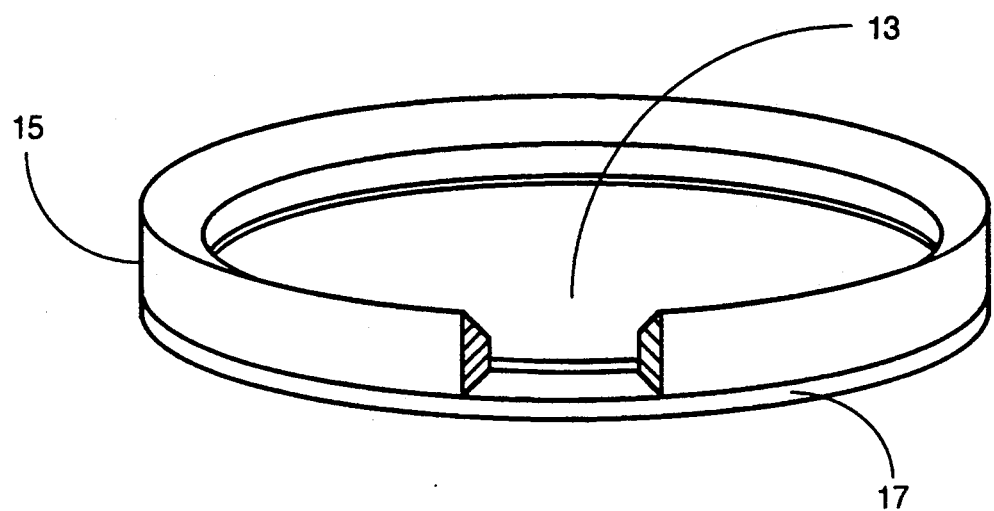
FIG. 1 is a perspective view of a wafer nested in a sacrificial metal ring according to a preferred embodiment of the invention.

In a preferred embodiment of the present invention as shown in FIG. 1, a nearly constant source of tungsten metal is provided during the etchback process by nesting a wafer 13 on a base member 17 within an annulus 15 having a surface of tungsten metal. The annulus surrounds the circular wafer during processing and its surface is etched just as the tungsten on the wafer is etched. In FIG. 1 annulus 15 is shown with a section cut away away to better illustrate wafer 13 nested within the annulus.

As the etchback process nears completion and the broader areas of tungsten on the wafer itself are etched away, the tungsten surface of the annulus loads the reaction, providing a sacrificial loading effect (SLE), offsetting the microloading effect. There is then no concentration of etching effect in the vias.

In the preferred embodiment annulus 15 has a surface of tungsten. In practice it has been found that other refractory metals, such as titanium or molybdenum, can be used. Also, in different reactors and processing different substrates, the sacrificial material can have other shapes, so the invention is useful for such as square or rectangular substrates as well as for wafers. The sacrificial member in the preferred embodiment has a base composed of another metal with a substantial portion of the exposed surface composed of tungsten or other refractory metal. Such a metal surface can be made by a number of metal working techniques known in the art, such as plasma spraying.

Figure 2:
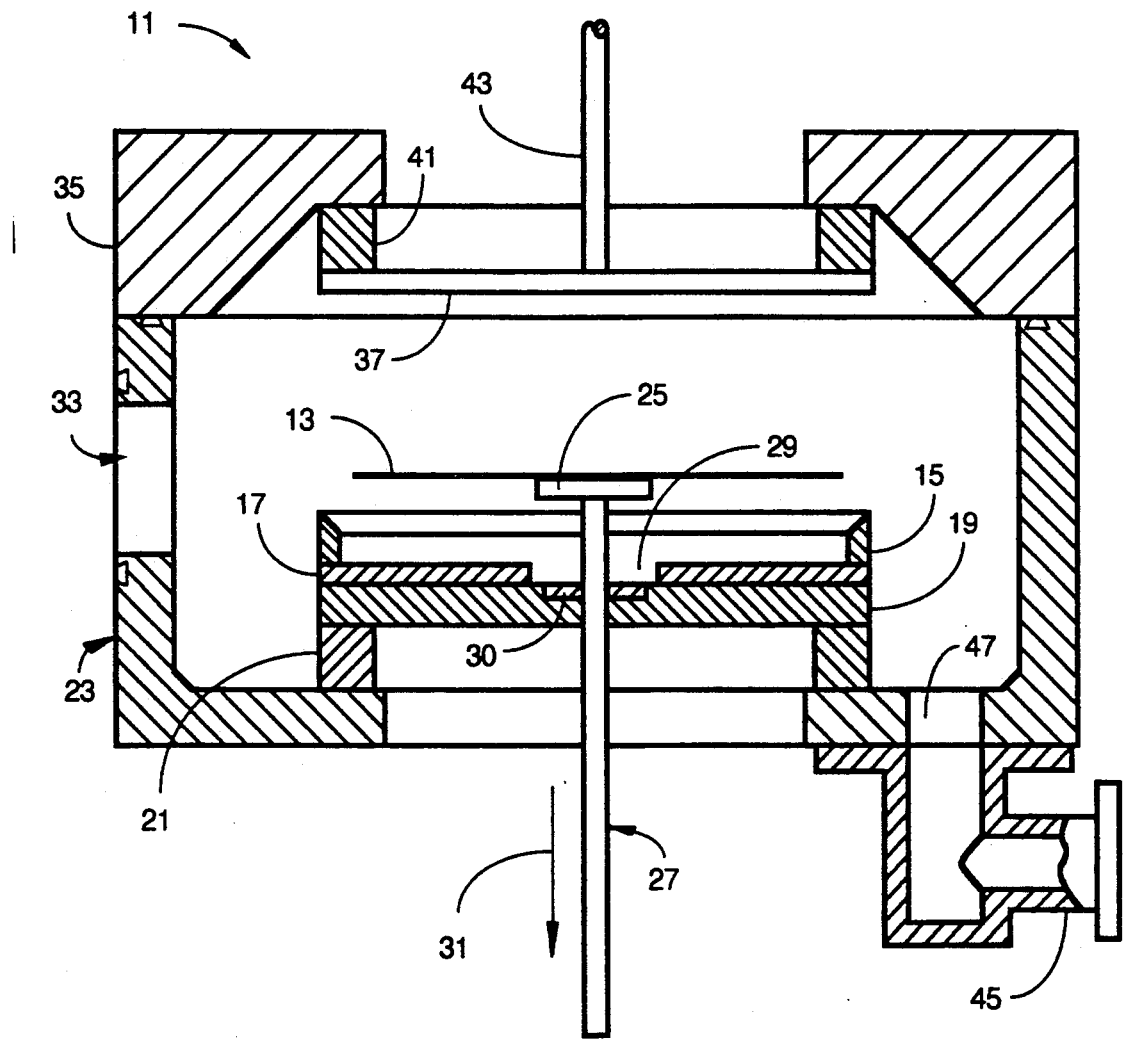
FIG. 2 is a vertical section of an etchback system with a sacrificial metal ring according to a preferred embodiment of the invention.

FIG. 2 shows a system 11 in vertical section with a sacrificial annulus 15 for nesting a wafer 13 during processing. Annulus 15 is supported by a first base member 17 having a circular opening 29 in the center. The first base member is made of a suitable, vacuum compatible metal or alloy, such as one of several kinds of stainless steel, in the preferred embodiment. First base member 17 is in turn supported by a second base member 19 which is in turn supported on an electrically insulating ring 21. In the preferred embodiment the material of the second base member can be the same as the material for the first base member, and the material of the insulating ring is a dielectric material such as quartz. The diameter of the ring in the preferred embodiment corresponds to the diameter of the wafer. It is preferable that the ring closely surround the wafer but that the inner diameter of the ring be a minimum of about .25 mm larger in diameter than the wafer to facilitate loading and unloading of wafers in the ring.

The height of the ring in the preferred embodiment can vary to change the surface area of the sacrificial material exposed to the etch reaction. The surface area of the sacrificial material relative to the surface area of tungsten being etched on the wafer controls the purposeful loading effect.

Insulating ring 21 is supported on the inside of a vacuum-tight process chamber 23, and the chamber, insulating ring, and the second base plate are sealed to one another by seals that are known in the art. A sliding member 27 passes through a linear vacuum seal 30 to operate a wafer support pedestal 25 inside the process chamber to allow loading of a wafer within the ring and unloading a wafer after processing.

Cathode plate 37 is sealed to an electrically insulating ring 41 similar to insulating ring 21, and ring 41 is sealed to a lid 35 that is in turn sealed to chamber 23 in the preferred embodiment such that cathode 37 is substantially parallel to base member 17. Cathode 37 is attached by an electrical connection (not shown) to the output of an alternating current power supply. In the preferred embodiment base member 19, and hence base member 17 and annulus 15 can be grounded when cathode 37 is powered. The reverse configuration is also useful. That is, members 15, 17 and 19, and thus wafer 13, can be powered while member 37 is grounded.

In the preferred embodiment the power supply is an RF frequency power supply operating at 13.56 MHz.

Also in the system of the preferred embodiment a vacuum pumping manifold 45 is connected to the chamber through openings such as opening 47 shown and to a vacuum pumping apparatus (not shown) to create vacuum and to pump etch gas and reactant gases during processing. Reactive gas for the etch process can be admitted to the chamber during processing through an inlet manifold 43 that provides gas in the preferred embodiment through openings around cathode 37.

A load/unload port 33 allows passage of a robotic transfer device (not shown) to admit wafers to the chamber and remove processed wafers. The robotic device extends through port 33 and places a wafer on support pedestal 25 while the pedestal is extended as shown in FIG. 2. Port 33 may be closed by a vacuum door not shown which may be opened with the vacuum pumps isolated to admit and remove wafers, or the port may be connected through a suitable valve to a load-lock chamber as known in the art so the process chamber need not be exposed to air between processing cycles.

After a wafer is placed on pedestal 25, the transfer device retracts and opening 33 is sealed. Sliding member 27 is retracted to lower wafer 13 onto base member 17 such that the wafer is supported on base member 17 and surrounded by annulus 15. Pedestal 25 nests in opening 29 within base member 17 so the wafer rests on the flat surface of base member 17 for electrical contact.

To initiate processing in the preferred embodiment reactive gas is introduced to the process chamber through inlet manifold 43 while pumping, and the power supply is turned on. A typical process gas for etching tungsten is a mixture of $SF_6$ and oxygen, and a typical RF power is about 400 watts at 13.56 MHz. There are many variations of gas mixture and power level and alternating current frequency known in the art.

When processing is complete power is switched off, gas flow is stopped, and the processed wafer is removed. As described above, as broader areas of metal are removed from the wafer, annulus 15 provides metal surface area to provide the sacrificial loading effect, and the microloading effect is offset.

It will be evident to one with skill in the art that there are many changes that may be made without departing from the spirit and scope of the invention. For example, there are many different shapes that may be imparted to the sacrificial metal surface area provided in the process by annulus 15, and the sacrificial element could be shaped differently for substrates with shapes other than round wafers. It is known, too, that other refractory metals can be substituted for the tungsten of the preferred embodiment. The chamber apparatus can also take many different forms known in the art, some configured for automatic handling, and a sacrificial element such as described in the preferred embodiment can be used with many commercially available etch chambers for etching wafers in the fabrication of semiconductor devices. There are similarly many other changes that may be made without departing from the spirit and scope of the invention.

What is claimed is:

1. An apparatus for etchback processing after via fill in integrated circuit manufacturing comprising:
    a base member for supporting a substrate during processing, the substrate having a surface to be etched comprising at lest two materials, one of which is a metal that comprises less of the surface area of the substrate than the other materials, and the others of which are nonmetals;
    a sacrificial metal structure supported by the base member and having a central opening of the shape of the periphery of the substrate, providing a nesting recess wherein the substrate may be placed and removed; and
    plasma generation apparatus for creating a plasma over the substrate and the sacrificial metal structure;
    wherein the sacrificial metal structure has a surface exposed to plasma consisting substantially of a refractory metal from Group VI of the periodic table.

2. An apparatus as in claim 1 wherein the substrate is a wafer in an integrated circuit manufacturing process and the sacrificial metal structure comprises a circular ring.

3. An apparatus as in claim 1 wherein the surface exposed to plasma comprises substantially tungsten metal.

4. A system for etchback processing after via fill in integrated circuit manufacturing, comprising:
    a chamber for confining the processing operations;
    a sealable opening through a wall of the chamber for loading and unloading substrates;
    a gas supply interfaced to the chamber for loading and unloading substrates;
    vacuum pumping apparatus attached to the chamber for evacuating atmospheric gases and for pumping the processing gases during processing;
    a base member within the chamber for supporting a substrate during processing, the substrate having a surface to be etched comprising at least two materials, one of which is a metal that comprises less of the surface area of the substrate than the other materials, and the others of which are non-metals;
    a sacrificial metal structure supported by the base member and having a central opening of the shape of the periphery of the substrate, providing a nesting recess wherein the substrate may be placed and removed; and
    plasma generation apparatus for creating a plasma over the substrate and the sacrificial metal structure;
    wherein the sacrificial metal structure has a surface exposed to plasma consisting substantially of a refractory metal from Group VI of the periodic table.

5. A system as in claim 4 wherein the substrate is a wafer in an integrated circuit manufacturing process and the sacrificial metal structure comprises a circular ring.

6. A system as in claim 4 wherein the surface exposed to plasma comprise substantially tungsten metal.

7. In a system for etchback processing of a substrate after via fill in integrated circuit fabrication, an apparatus for eliminating microloading comprising:
    a cathode and an anode for establishing an alternating electrical field in the system, the cathode and the anode configured such that the substrate can be placed therebetween for etching back the surface of the substrate, the surface to be etched comprising at least two materials, one of which is a metal that comprises less of the surface area of the substrate than the other materials, and the others of which are non-metals;
    wherein one of the cathode and the anode comprise a support surface for the substrate, the one of the cathode and the anode hereinafter referred to as support; and
    a sacrificial metal structure contacting the support, having an exterior consisting substantially of a refractory metal from Group VI of the periodic table, and having a central opening of the shape of the periphery of the substrate, providing a nesting recess wherein the substrate may be placed and removed, the sacrificial metal structure for providing the metal as sacrificial metal during processing.

8. An apparatus as in claim 7 wherein the substrate is a wafer in an integrated circuit manufacturing process and the sacrificial metal structure comprises a circular ring.

9. An apparatus as in claim 7 wherein the surface exposed to plasma comprises substantially tungsten metal.

* * * * *